(12) United States Patent
Eskeldson et al.

(10) Patent No.: US 6,864,761 B2
(45) Date of Patent: Mar. 8, 2005

(54) DISTRIBUTED CAPACITIVE/RESISTIVE ELECTRONIC DEVICE

(75) Inventors: David D. Eskeldson, Colorado Springs, CO (US); Martin L Guth, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 53 days.

(21) Appl. No.: 10/277,401

(22) Filed: Oct. 22, 2002

(65) Prior Publication Data

US 2004/0075510 A1 Apr. 22, 2004

(51) Int. Cl.[7] .......................... H03H 1/02; G01R 31/02
(52) U.S. Cl. .................... 333/172; 333/22 R; 324/72.5; 324/149
(58) Field of Search .............................. 333/172, 22 R, 333/81 R, 81 A; 324/72.5, 149

(56) References Cited

U.S. PATENT DOCUMENTS

| | | | | |
|---|---|---|---|---|
| 3,371,295 A | * | 2/1968 | Bourgault et al. | 333/172 |
| 3,569,872 A | * | 3/1971 | Berlin | 333/172 |
| 3,859,592 A | * | 1/1975 | Kessler | 323/370 |
| 4,408,170 A | * | 10/1983 | Rapeli et al. | 333/172 |
| 4,743,839 A | * | 5/1988 | Rush | 324/72.5 |
| 5,172,051 A | * | 12/1992 | Zamborelli | 324/72.5 |
| 5,598,131 A | * | 1/1997 | Mazzochette | 333/22 R |
| 5,889,445 A | * | 3/1999 | Ritter et al. | 333/172 |

* cited by examiner

Primary Examiner—Stephen E. Jones

(57) ABSTRACT

A distributed capacitive/resistive electronic device. An electronic device is described which includes a dielectric substrate, a first resistive component, a second resistive component, and a connecting component. The first resistive component is affixed to a first side of the dielectric substrate. The second resistive component is affixed to a second side of the dielectric substrate, wherein the second side is oppositely located from the first side. The connecting component is affixed to the dielectric substrate, wherein the connecting component electrically connects the first resistive component to the second resistive component, wherein the connecting component is electrically connectable to other electronic circuitry, and wherein, at a location removed from the connecting component, the second resistive component is electrically connectable to other electronic circuitry.

4 Claims, 11 Drawing Sheets

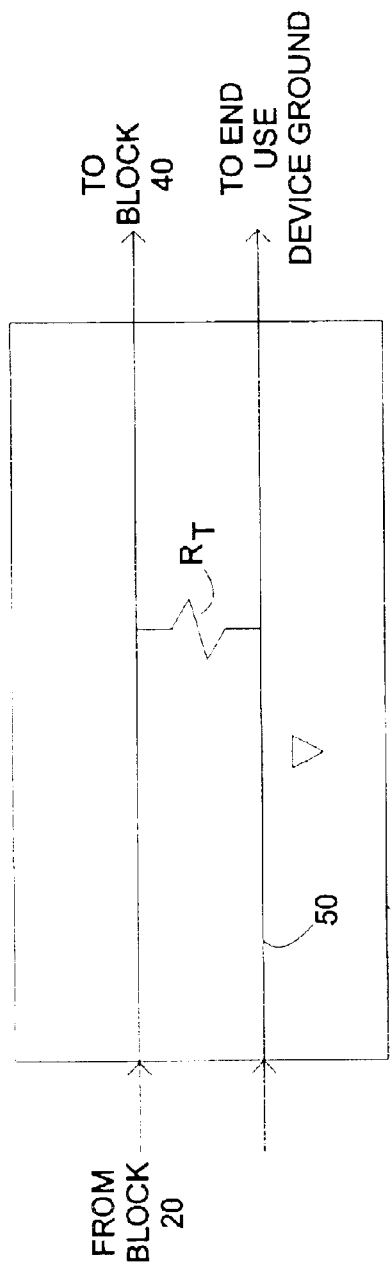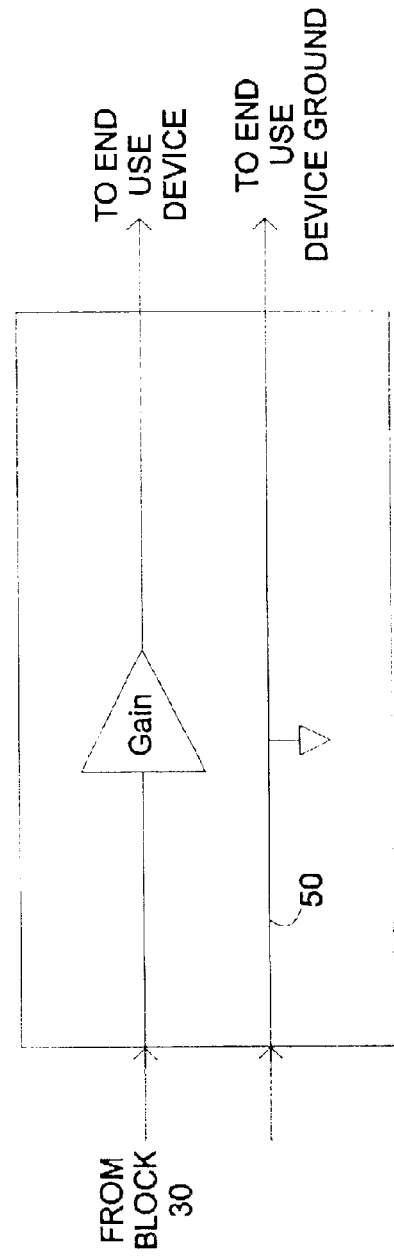

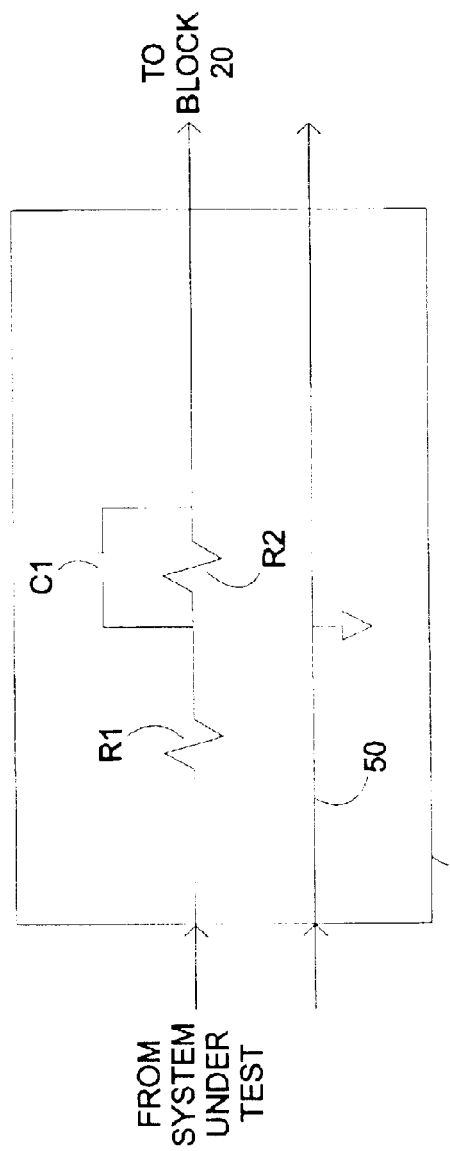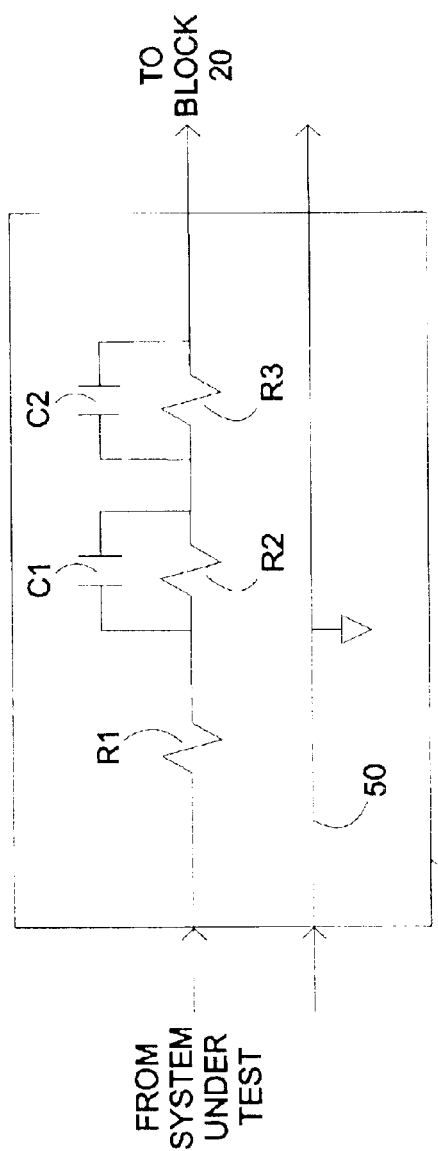

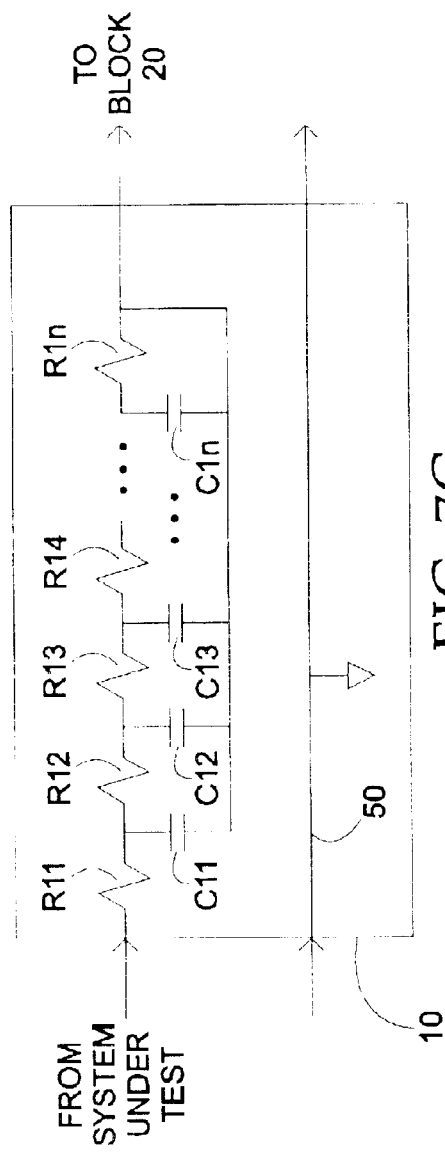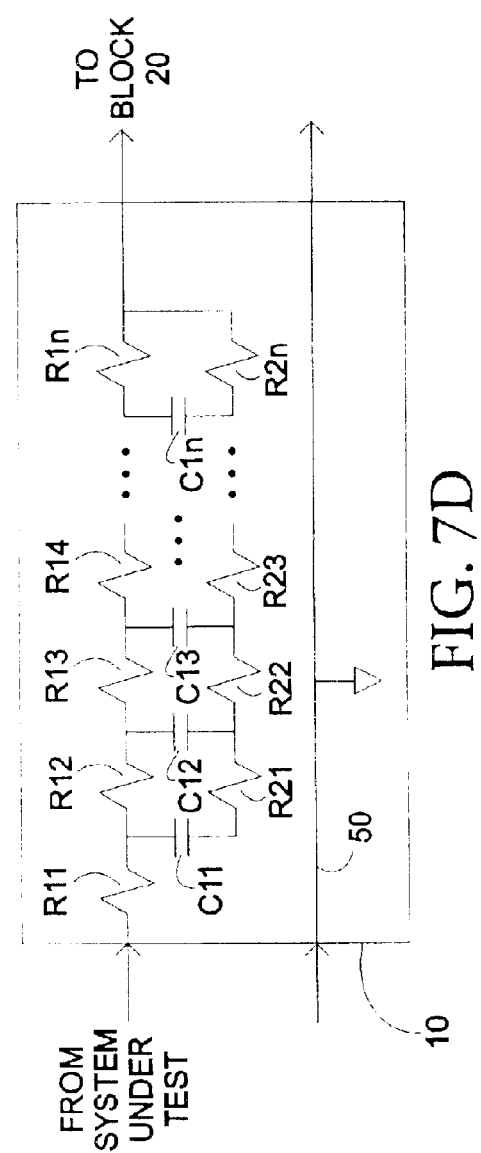

SINGLE ZERO TRANSFER FUNCTION

SINGLE POLE TRANSFER FUNCTION

POLE-ZERO PAIR TRANSFER FUNCTION

UNCOMPENSATED LOSSY TRANSMISSION LINE TRANSFER FUNCTION

SINGLE POLE-ZERO PAIR COMPENSATION TRANSFER RESPONSE

TWO POLE-ZERO PAIR TRANSFER FUNCTION

TWO POLE-ZERO PAIR COMPENSATION TRANSFER FUNCTION

DISTRIBUTED CAPACITIVE/RESISTIVE ELECTRONIC DEVICE

FIELD

The present invention relates generally to distributed electronic devices.

BACKGROUND

In many high-frequency applications, a transmission line medium, as for example a coax cable or a strip line, is used so that one part of the system can be physically located at some distance from another part. Such an application could be, for example, the testing of a target device by a test system by connecting probes to the target device with transmission lines interconnecting the probes to the test system. Ideally such probes should detect and replicate the high speed electronic signals present in the target device with a minimum disturbance of the signal and a maximum fidelity of replication. These devices are commonly used for analyzing signals detected by electronic measurement equipment, including, for example, oscilloscopes and logic analyzers.

The usefulness of a probe depends upon the range of frequencies for which the response is true to the detected signal, the accuracy of replication, and the extent to which the probe detects the signal without detrimentally affecting the operation of the system or circuit being probed. If the input impedance of the combined probe and end-use device is the same order of magnitude as that of the circuit or system being probed, it may cause errors in the replication of the signal or a change in the operation of the circuit or system resulting in erroneous output or circuit malfunction. High probe tip capacitance will also cause circuit loading problems at higher frequencies. Designing the probe to have low capacitance and an input impedance which is high relative to the impedance of the circuit being probed at the point of probing has been the common protection against these errors. This high impedance results in only a small current to flow through the probe, allowing the target device to operate relatively undisturbed.

One measure of a probe is its intrusiveness or loading which is dependent upon the capacitance of the probe in parallel with the source resistance of the circuit under test. The capacitive reactance varies as a function of frequency resulting in the impedance of the probe also varying with frequency. The loading of previously available probes has been limited, because the impedance of the probes falls at high frequencies. Minimizing the capacitance of the probe has been one solution for reducing the loading of the probe. Compensating for probe tip capacitance by using active electronics at the probe tip is an alternative which has been used for extending the effective bandwidth of the probe tip. Such compensation, however, has generally resulted in a bulky and easily damaged probe tip.

Typical previously available probes included high resistance probes which minimized resistive loading and had high input impedance at D.C., but which had an impedance that fell off rapidly with increasing frequency due to high input capacitance. High impedance cable was used with these probes to minimize capacitance, but this cable was very lossy at high frequencies, limiting bandwidth. Such probes also required the measuring instrument to have a high impedance.

Also previously available were passive or resistive divider probes which had the lowest input capacitances available in a probe and therefore had a very broad bandwidth. However, the low input resistance could cause problems with resistive loading which could force the circuit under test into saturation, nonlinear operation, or to stop operating completely. Resistive divider probes in general do not have any inherent ability to compensated for transmission line losses.

Still other probes were active field effect transistor probes which had active electronics at the probe tip to compensate for loading problems due to low input impedance. These probes had a higher input impedance than the resistive divider probes and a lower capacitance than the high impedance probes, but were limited in bandwidth due to the field effect transistors. They were also bulky and easily damaged.

In other fields, a concept called pole-zero cancellation has been known. One application in which the concept was used was in a system for measuring heart rate disclosed by Lanny L. Lewyn in U.S. Pat. No. 4,260,951 entitled "Measurement System Having Pole Zero Cancellation". In that system, pole-zero cancellation was used to cancel the long differentiation time constant so as to remove undesired shaping of the heart pressure wave caused by the second order feedback loop. This allowed the waveform to be refined so that it could enable greater accuracy in measuring the heart rate.

More recently, wide bandwidth probes with pole-zero cancellation have been utilized in probe tips. In U.S. Pat. No. 4,743,839 entitled"Wide Bandwidth probe Using Pole-Zero Cancellation" by Kenneth Rush, a pair of tip components and a pair of feedback components are utilized to obtain pole-zero cancellation. Values for the components are chosen such that a zero created by an RC circuit at the tip of the probe occurs at the same frequency as the pole created by a feedback circuit. The result of this design is probe circuitry that has constant gain over all frequencies.

In such high-frequency probing applications, a transmission line medium, as for example a coax cable or strip-line, is used so that the test equipment can be physically located at some distance from the target device to be probed. However, the transmission line impedance is typically low compared to that of the target device which can result in unacceptable loading of the target. To isolate the target device from the loading effects of the transmission line, passive networks at or very near the target are typically used. These isolation networks raise the impedance of the transmission line as seen by the target at the cost of reducing the signal strength as seen by the test equipment at the other end of the transmission line.

The transmission line medium typically has a measurable, frequency dependent insertion loss due to the effects of skin effect and a lossy dielectric medium. If insertion losses occur at frequencies low enough to be in the frequency band of measurement, these losses can result in an attenuation of the signal, as well as a distortion of the waveform with associated measurement error. It is therefore, desirable in many applications to compensate for these transmission line medium losses in order to achieve a higher usable bandwidth for the system.

The frequency characteristics of transmission line insertion losses are not simple poles. A generally accepted formula for describing the frequency characteristics of the insertion loss is a magnitude roll-off as a function of the square root of the frequency of interest. While pole-zero compensation circuits can be used to improve lossy transmission line response, the loss characteristic of the line is not a simple pole circuit falling off at 20 dB/decade. As such, the loss characteristics of the line cannot be adequately compensated for by simply using a circuit having a zero at the appropriate frequency.

SUMMARY

In representative embodiments, a distributed capacitive/resistive electronic device is disclosed. The electronic device comprises a dielectric substrate, a first resistive component, a second resistive component, and a connecting component. The first resistive component is affixed to a first side of the dielectric substrate. The second resistive component is affixed to a second side of the dielectric substrate, wherein the second side is oppositely located from the first side. The connecting component is affixed to the dielectric substrate, wherein the connecting component electrically connects the first resistive component to the second resistive component, wherein the connecting component is electrically connectable to other electronic circuitry, and wherein, at a location removed from the connecting component, the second resistive component is electrically connectable to other electronic circuitry.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements.

FIG. 4 is a drawing of an embodiment of a termination network as shown in FIG. 1.

FIG. 5 is a drawing of an embodiment of an amplifier as shown in FIG. 1.

FIG. 7A is a drawing of an embodiment of another probe tip network as shown in FIG. 1.

FIG. 7B is a drawing of an embodiment of still another probe tip network as shown in FIG. 1.

FIG. 7C is a drawing of an embodiment of yet another probe tip network as shown in FIG. 1.

FIG. 7D is a drawing of an embodiment of an additional probe tip network as shown in FIG. 1.

DETAILED DESCRIPTION

Figure 1:
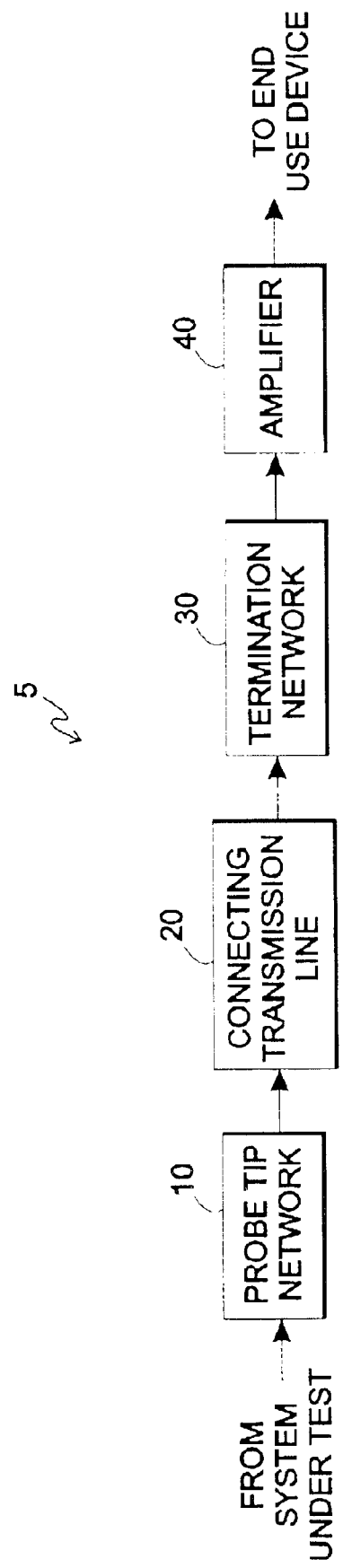
FIG. 1 is a drawing of a block diagram of an embodiment of a compensated probe network consistent with the teachings of the present patent document.

As shown in the drawings for purposes of illustration, the present patent document relates to a novel method for the high-frequency compensation of electronic devices, more specifically to the compensation of frequency dependent losses in transmission lines. Previous methods have not been able to adequately compensate for such frequency dependent losses.

In the following detailed description and in the several figures of the drawings, like elements are identified with like reference numerals.

Lossy transmission line insertion loss cannot be adequately compensated by the use of a single zero or even by a couple pole-zero compensations. As disclosed herein, one solution to this problem is a continuously varying compensation technique comprising devices having zeros distributed in frequency. In a representative embodiment, two thickfilm resistors are printed on a dielectric substrate thereby creating a parallel plate capacitor between the resistive elements. One resistor has mating contacts at both ends. The other resistor only connects to the primary resistor at one end. The two resistors, when placed adjacent to or over each other, create a parallel-plate capacitor that is distributed along the length of the resistors. The capacitor plates comprise resistive material resulting in a lossy distributed capacitor. The geometries of the resistors and thickness of the thickfilm substrate, as well as its dielectric constant, determine the capacitance between the resistive elements. The resistive paste parameters, as well as the thickness of the paste and the geometries used, determine the resistance of the resistors and controls the degree of loss in the capacitive coupling. By controlling the geometries involved and the resistive paste used, the response can be shaped to compensate for transmission line insertion losses. Instead of a single-zero compensation, this circuit yields a multi-pole-zero compensation of a distributed nature.

Discrete components can create a piece-wise, approximate compensation for the cable losses. However, such approaches typically are cumbersome due to the number of discrete components involved, the physical space required for such a technique, and the inherent parasitics involved with multiple discrete components. As disclosed herein, a discrete component that is a continuous approximation of the cable loss instead of a piece-wise approximation of the cable loss can reduce the complexity of the compensation circuitry.

FIG. 1 is a drawing of a block diagram of an embodiment of a compensated probe network 5 consistent with the teachings of the present patent document. In FIG. 1, a probe tip network 10 is capable of detecting a signal from a system under test. A connecting transmission line 20 is connected to the probe tip network 10 at one end. At the other end of the connecting transmission line 20, the connecting transmission line 20 is connected to one end of a termination network 30. At the other end of the termination network 30, the termination network 30 is connected to an amplifier 40. The probe tip network 10 detects a signal from the system under test and transfers it to the connecting transmission line 20 which in turn transfers the signal to the termination network 30 which in its turn transfers the signal to the amplifier 40. The probe tip network 10 compensates for the frequency dependent transfer function of the connecting transmission line 20. The termination network 30 appropriately terminates connecting transmission line 20 to reduce signal reflections at amplifier 40. The amplifier 40 reproduces the detected signal for the end-use device which could be, for example, an oscilloscope or a logic analyzer.

Figure 2:
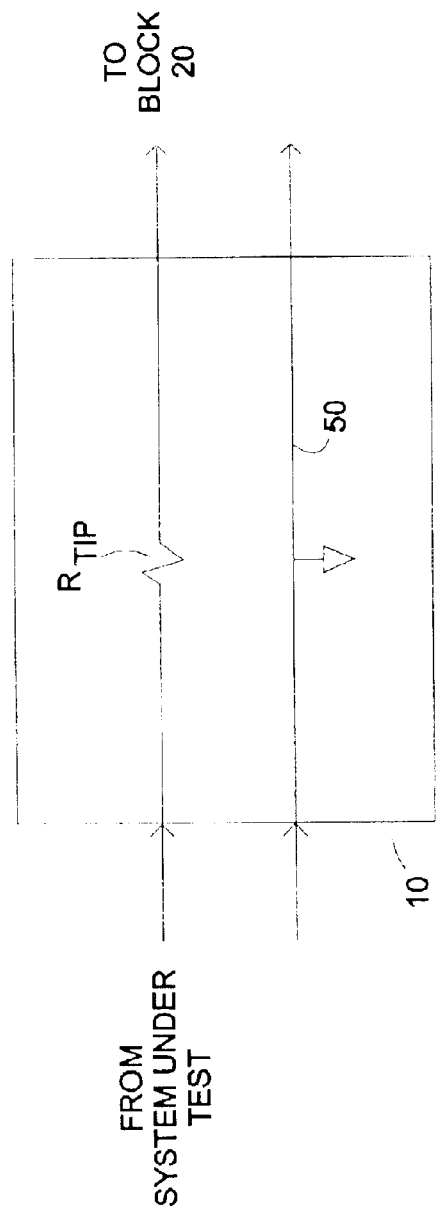
FIG. 2 is a drawing of an embodiment of a probe tip network as shown in FIG. 1.

FIG. 2 is a drawing of an embodiment of a probe tip network 10 as shown in FIG. 1. In FIG. 2, the probe tip network 10 is a passive resistive-divider probe 10 which comprises a resistor $R_{TIP}$. The signal from the system under test is detected with respect to system ground 50 and transferred to the connecting transmission line 20 also with respect to system ground 50.

Figure 3:
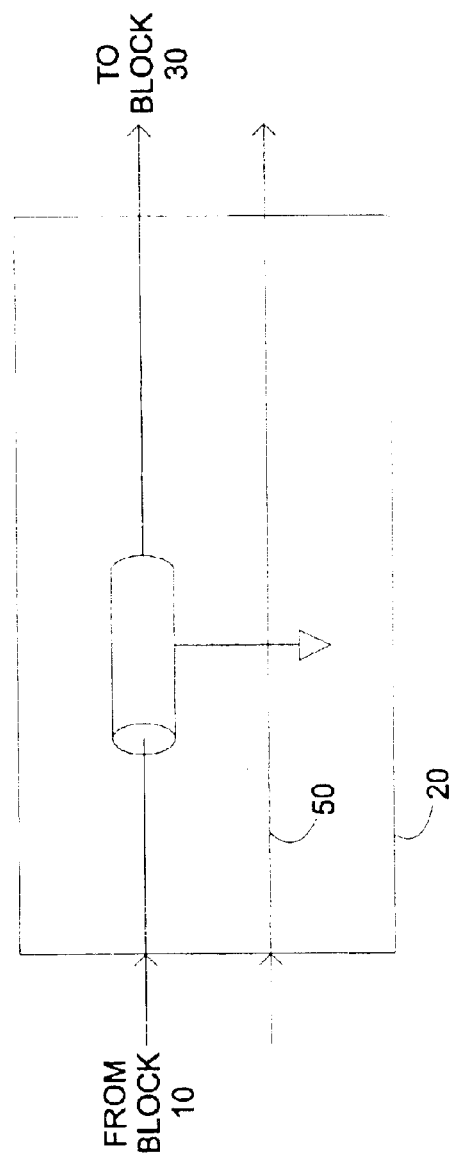
FIG. 3 is a drawing of an embodiment of a connecting transmission line as shown in FIG. 1.

FIG. 3 is a drawing of an embodiment of a connecting transmission line 20 as shown in FIG. 1. In representative embodiments the connecting transmission line 20 is fabricated as either a coaxial cable, a strip line, a microstrip, or a waveguide. FIG. 3 indicates a coaxial cable wherein the system ground 50 is the outer shield of the coaxial cable.

FIG. 4 is a drawing of an embodiment of a termination network 30 as shown in FIG. 1. In the representative embodiment of FIG. 4, the termination network 30 comprises terminating resistor $R_T$.

FIG. 5 is a drawing of an embodiment of an amplifier 40 as shown in FIG. 1. In the representative embodiment of FIG. 1, the amplifier 40 comprises a generic amplifier.

For an ideal lossless connecting transmission line 20, terminating resistor $R_T$ is set to a value such that the parallel combination of the input impedance of the amplifier 40 and terminating resistor $R_T$ matches the characteristic impedance of the connecting transmission line 20 thereby eliminating signal reflections at the amplifier 40 end of the connecting transmission line 20. The connecting transmission line 20 then presents the characteristic impedance of the connecting transmission line 20 at its connection to the probe tip network 10. For this ideal case, the characteristic impedance of the connecting transmission line 20 is resistive, and therefore has no frequency dependence. The resistor $R_{TIP}$ is made sufficiently large such that the series combination of $R_{TIP}$ and the characteristic impedance of the connecting transmission line 20 does not significantly load down the system under test. A typical choice for the series combination of resistor $R_{TIP}$ and the characteristic impedance of the connecting transmission line 20 is 10 times that of the impedance of the system under test at the point to which the probe tip network 10 is attached. For such a choice, the attachment of the probe tip network 10 to the system under test typically does not significantly alter the functioning of the system under test.

Figure 6:
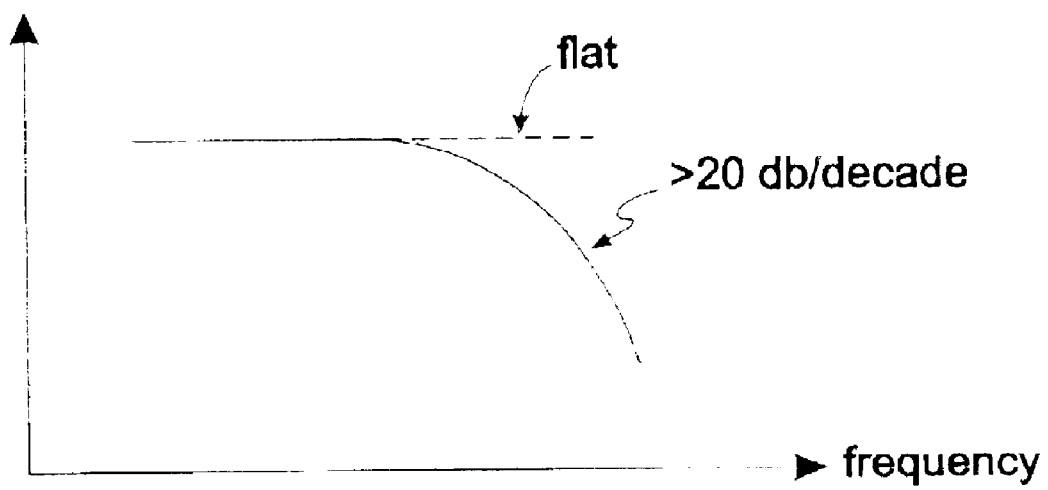
FIG. 6 is a drawing of a transfer function of a lossy transmission line vs. frequency of the embodiment of the connecting transmission line as shown in FIG. 3.

In real systems, however, the connecting transmission line 20 is not lossless but has a loss distributed throughout its length. FIG. 6 is a drawing of a transfer function of a lossy transmission line 20 vs. frequency of the embodiment of the connecting transmission line 20 as shown in FIG. 3. The transfer function of the lossy connecting transmission line 20 falls off at approximately 20 db per decade of frequency.

Various embodiments of probe tip networks 10 as shown in FIG. 1 are shown in FIGS. 7A–7D.

FIG. 7A is a drawing of an embodiment of another probe tip network 10 as shown in FIG. 1. In FIG. 7A, the probe tip network 10 comprises a first resistor R1 in series with a parallel combination of a second resistor R2 and a first capacitor C1. The signal from the system under test is detected with respect to system ground 50 and transferred to the connecting transmission line 20 also with respect to system ground 50.

FIG. 7B is a drawing of an embodiment of still another probe tip network 10 as shown in FIG. 1. In FIG. 7B, the probe tip network 10 comprises a first resistor R1 in series with a parallel combination of a second resistor R2 and a first capacitor C1 and further in series with a parallel combination of a third resistor R3 and a second capacitor C2. The signal from the system under test is detected with respect to system ground 50 and transferred to the connecting transmission line 20 also with respect to system ground 50.

FIG. 7C is a drawing of an embodiment of yet another probe tip network 10 as shown in FIG. 1. In FIG. 7C, the probe tip network 10 comprises a series of resistors R11 . . . R1n shunted variously by a series of capacitors Ci1 . . . C1n.

FIG. 7D is a drawing of an embodiment of an additional probe tip network 10 as shown in FIG. 1. FIG. 7D differs from FIG. 7C in that each of a series of resistors R2 . . . R2n connects between the capacitors C11 . . . C1n.

Figure 8A:
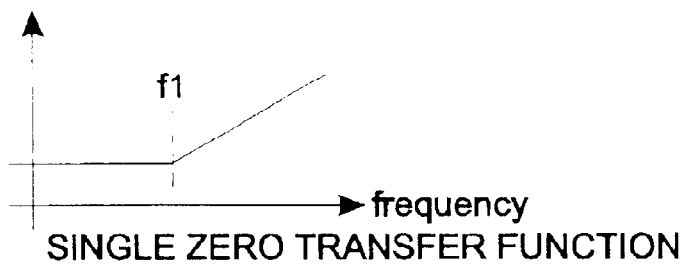
FIG. 8A is a drawing of a transfer function vs. frequency of the parallel combination of the second resistor and the first capacitor of FIG. 7A.

Various transfer functions associated with the embodiments of the probe tip network 10 of FIG. 7A are shown in FIGS. 8A–8E. Once again in FIG. 7A, the probe tip network 10 comprises a first resistor R1 in series with a parallel combination of a second resistor R2 and a first capacitor C1. FIG. 8A is a drawing of a transfer function vs. frequency of the parallel combination of the second resistor R2 and the first capacitor C1 of FIG. 7A. In FIG. 8A, the transfer function of the parallel combination of second resistor R2 and first capacitor C1 has a zero at frequency f1 wherein $f1=1/(2\pi CR2*C1)$.

Figure 8B:
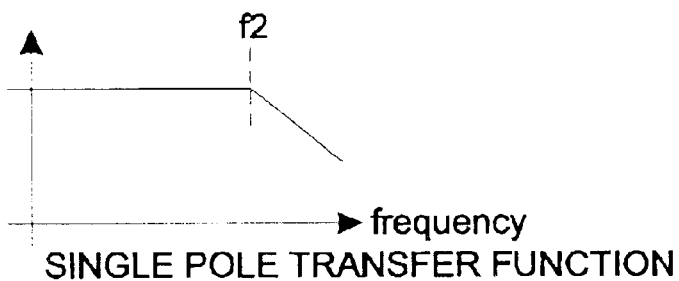
FIG. 8B is a drawing of a transfer function vs. frequency of the series combination of the first resistor and the first capacitor of FIG. 7A.

FIG. 8B is a drawing of a transfer function vs. frequency of the series combination of the first resistor R1 and the first capacitor C1 of FIG. 7A. In contrast to the zero in the transfer function of FIG. 8A, in FIG. 8B the transfer function of the parallel combination of first resistor R1 and first capacitor C1 has a pole at frequency f2 wherein $f2=1/(2\pi R1*C1)$.

Figure 8C:
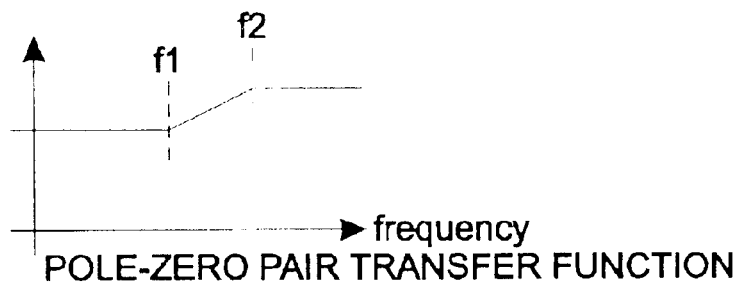
FIG. 8C is a drawing of a transfer function vs. frequency of the embodiment of the probe tip network shown in FIG. 7A.

FIG. 8C is a drawing of a transfer function vs. frequency of the embodiment of the probe tip network 10 shown in FIG. 7A. By setting the value of f2 to be greater than that of f1 via the appropriate selection of values for R1, R2, and C1, the transfer function at frequencies greater than f1 will be larger than that of the transfer function below f1. The actual value of the transfer function at the higher frequencies relative to that of the lower frequencies is dependent upon the value of f2 relative to the value of f1.

Figure 8D:
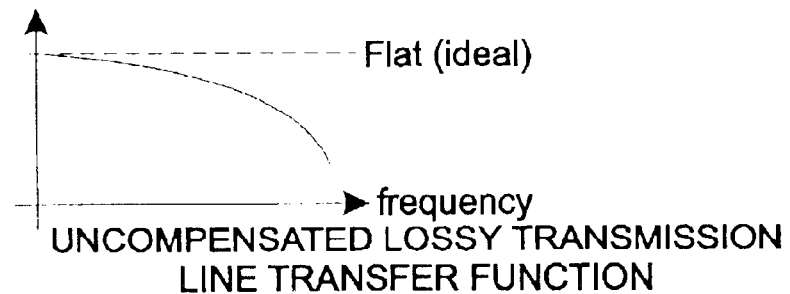
FIG. 8D is a redrawing of the transfer function of a lossy transmission line vs. frequency as shown in FIG. 6. The transfer function of FIG. 8D is for the uncompensated lossy transmission line.

FIG. 8D is a redrawing of the transfer function of a lossy transmission line vs. frequency as shown in FIG. 6. The transfer function of FIG. 8D is for the uncompensated lossy transmission line 20.

Figure 8E:
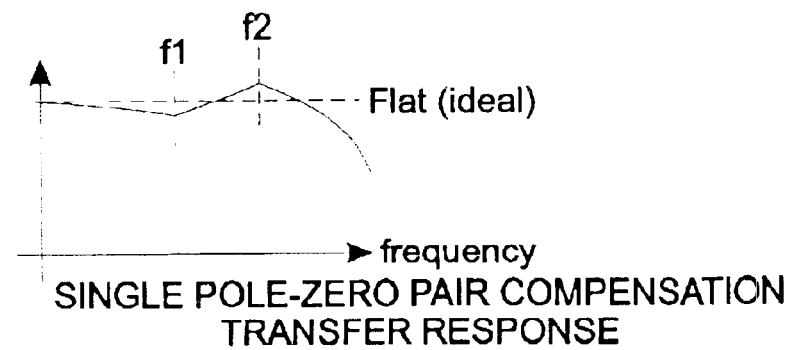
FIG. 8E is a drawing of the transfer function for the combination of the lossy transmission line compensated by the probe tip network of FIG. 7A.

FIG. 8E is a drawing of the transfer function for the combination of the lossy transmission line 20 compensated by the probe tip network 10 of FIG. 7A. The resulting "gain" of the pole-zero pair transfer function can be used to extend the useful bandwidth of the lossy connecting transmission line 20.

The technique of FIG. 7A is extended in FIG. 7B. The additional parallel combination of third resistor R3 and second resistor C2 provide an additional pole-zero compensation pair. The second zero occurs at $f3=1/(2\pi R3*C2)$ with the second pole at $f4=1/(2\pi(R1+R2)*C3)$.

Figure 9A:
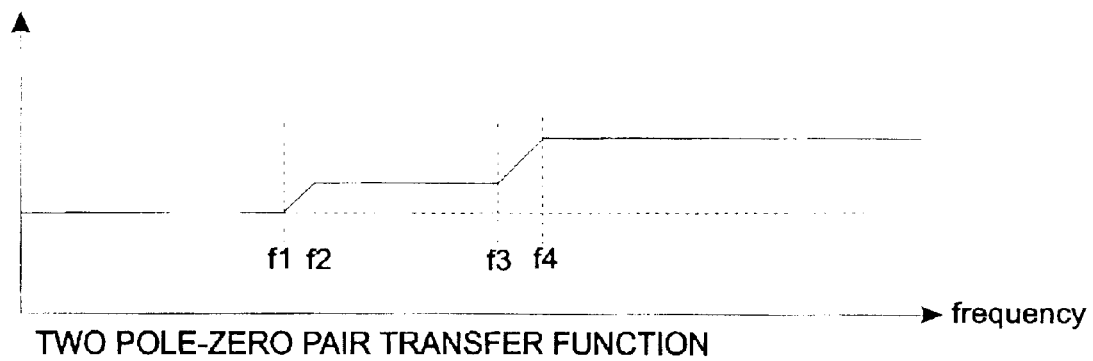
FIG. 9A is a drawing of a transfer function vs. frequency of the embodiment of the probe tip network shown in FIG. 7B.
Figure 9B:
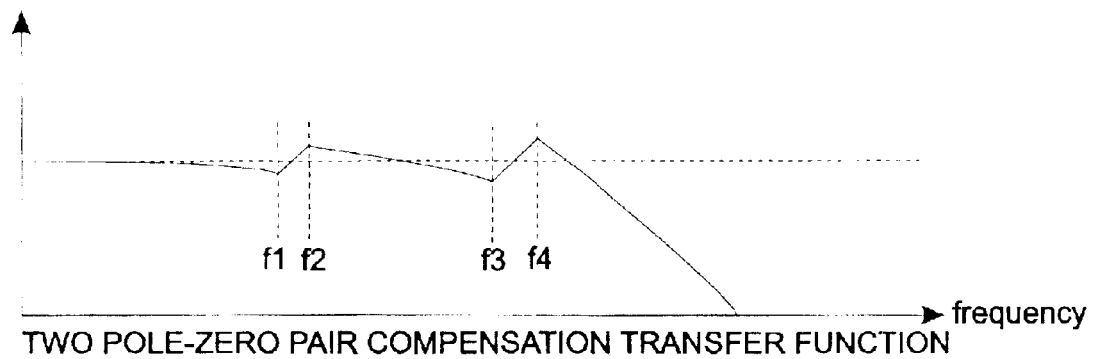
FIG. 9B is a drawing of the transfer function for the combination of the lossy transmission line compensated by the probe tip network of FIG. 7B.

Various transfer functions associated with the embodiments of the probe tip network 10 of FIG. 7B are shown in FIGS. 9A–9B. Once again in FIG. 7B, the probe tip network 10 comprises the first resistor R1 in series with the parallel combination of the second resistor R2 and the first capacitor C1, all of which are in series with the parallel combination of the third resistor R3 and the second capacitor C2.

FIG. 9A is a drawing of a transfer function vs. frequency of the embodiment of the probe tip network 10 shown in FIG. 7B. By setting the value of f4 to be greater than that of f3, the value of f3 to be greater than that of f2, and the value of f2 to be greater than that of f1 by appropriate selection of values for R1, R2, R3, C1, and C2, the transfer function at frequencies greater than f4 will be larger than that of the transfer function between f3 and f2, and the transfer function at frequencies between f3 and f2 will be larger than that of the transfer function at frequencies less than f1. The actual values of the transfer function at the higher and mid-range frequencies relative to that of the lower frequencies is dependent upon the value of f4 relative to the value of f3 and upon the value of f2 relative to the value of f1.

FIG. 9B is a drawing of the transfer function for the combination of the lossy transmission line 20 compensated by the probe tip network 10 of FIG. 7B. The resulting "gain" of the two pole-zero pair transfer function can be used to extend the useful bandwidth of the lossy connecting transmission line 20 to a greater extent than can the transfer function of the single pole-zero pair of FIG. 7A.

The compensation techniques of FIGS. 8A and 8B could be extended to even greater frequencies by the inclusion of additional parallel pairs of a resistor and a capacitor with appropriately chosen pole-zero frequencies. However, the size and associated parasitic capacitances of such probe tip networks 10 fabricated using discrete components makes such extensions impractical.

Figure 10A:
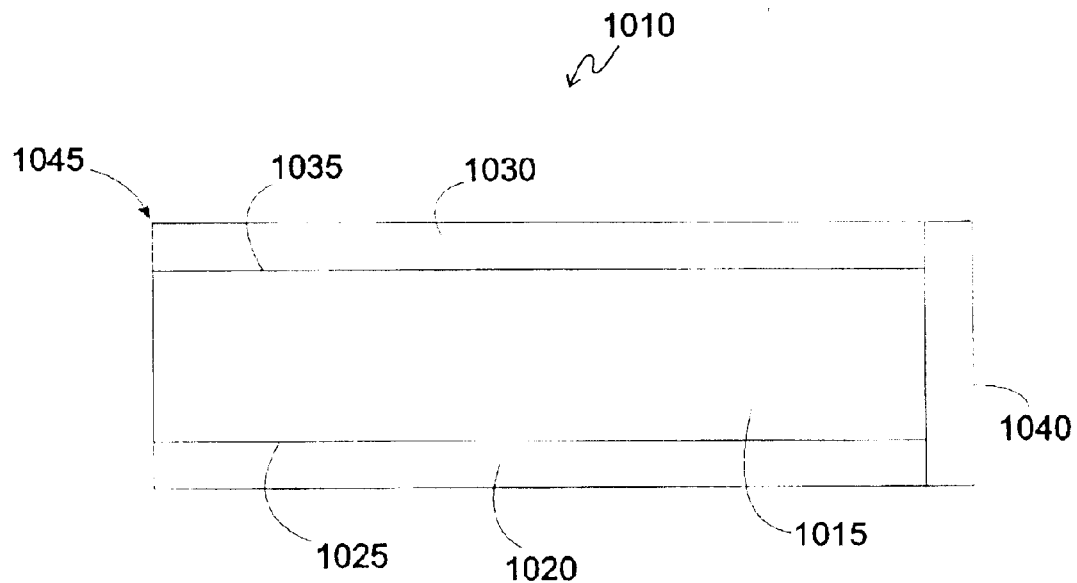
FIG. 10A is a drawing of a side view of an embodiment of a distributed capacitive/resistive electronic device consistent with the teachings of the invention.

FIG. 10A is a drawing of a side view of an embodiment of a distributed capacitive/resistive electronic device 1010 consistent with the teachings of the invention. The electronic device 1010 comprises a dielectric substrate 1015 on which a first resistive component 1020 is affixed to a first side 1025 of the dielectric substrate 1015 and on which a second resistive component 1030 is affixed to a second side 1035 of the dielectric substrate 1015. The second side 1035 is oppositely located from the first side 1025. The distributed capacitive/resistive electronic device 1010 further comprises a connecting component 1040 affixed to the dielectric substrate 1015. The connecting component 1040 further electrically connects the first resistive component 1020 to the second resistive component 1030 and is electrically connectable to other electronic circuitry, as for example the connecting transmission line 20. At a location 1045 removed from the connecting component 1040, the second resistive component 1030 is electrically connectable to additional electronic circuitry, as for example the system under test. The capacitive/resistive electronic device 1010 could be fabricated by standard thick film techniques, wherein the first and second resistive components 1020,1030 comprise resistive pastes affixed to the dielectric substrate 1015 via common thick film screening processes which are well known in the art. Typically the second resistive component 1030 has a higher resistivity than does the first resistive component 1020. The connecting component 1040 could be affixed to the dielectric substrate 1015 through a hole drilled in the dielectric substrate 1015 which is subsequently electroplated prior to the screening of the first and second resistive components 1020,1030. The connecting component 1040 could also be affixed to the dielectric substrate 1015 through the drilled hole in the dielectric substrate 1015 and then a conductive paste screened through the hole to make contact to the first and second resistive components 1020,1030. Connection between the connecting component 1040 and the first and second resistive components 1020, 1030 could also be effected via screening or electroplating around the end of the dielectric substrate 1015 without use of a drilled hole. Other means are also possible.

Figure 10B:
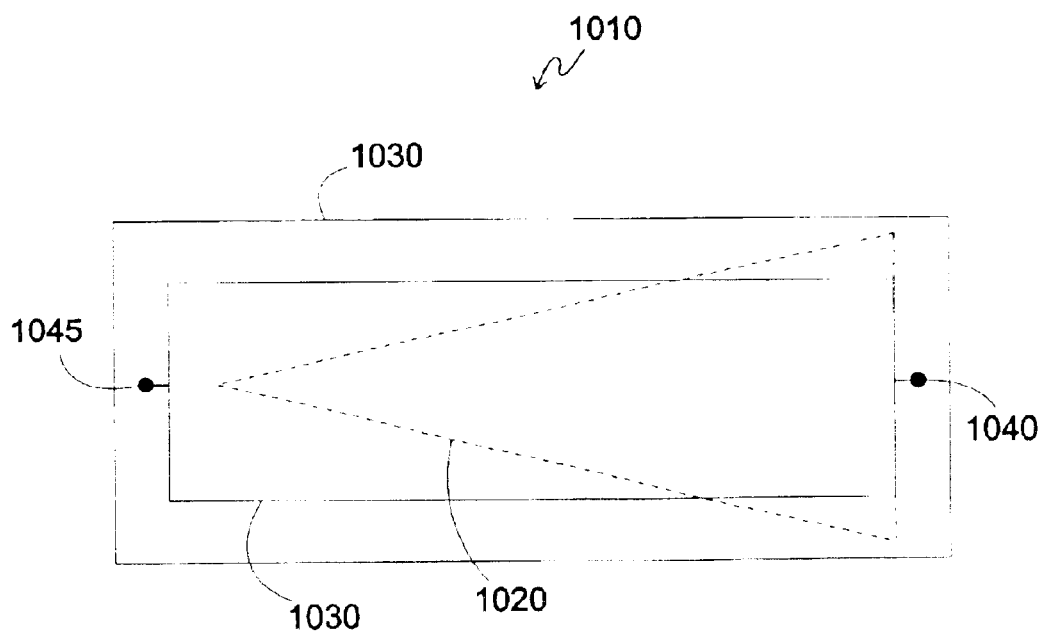
FIG. 10B is a drawing of a top view of the distributed capacitive/resistive electronic device of FIG. 10A.

FIG. 10B is a drawing of a top view of the distributed capacitive/resistive electronic device 1010 of FIG. 10A. In FIG. 10B, the first resistive component 1020 is non-uniformly distributed the length of the electronic device 1010 with respect to the second resistive component 1030. For illustrative purposes the first resistive component 1020 is shown having greater width near the connecting component 1040 than that of the second resistive component 1030. However, the width of first resistive component 1020 could be the same as or less than that of the second resistive component 1030 near the connecting component 1040. Also in FIG. 10B, the dielectric substrate 1015 is shown as having a width greater than that of both the first and second resistive components 1020,1030. However, the width of the dielectric substrate 1015 could be equal to the width of the wider of the first and second resistive components 1020,1030. Connection between the connecting component 1040 and the first and second resistive components 1020,1030 could be effected as described above. Also, in FIG. 10B, the first resistive component 1020 is shown as a triangle. However, the geometry of the first resistive component 1020 could be any other geometry, including that of a rectangle or square, found to be suitable for compensating for the lossy connecting transmission line 20. Further in FIG. 10B, the second resistive component 1030 is shown as a rectangle. However, the geometry of the second resistive component 1030 could be any other geometry, including that of a triangle or square, found to be suitable for compensating for the lossy connecting transmission line 20

The equivalent circuit of the distributed capacitive/resistive electronic device 1010 of FIGS. 10A–10B is the circuit of FIG. 7C for the case in which the second resistive component 1030 is highly conductive relative to the first resistive component 1020. For this case the resistivity of the first resistive component 1020 is typically at least ten times greater than that of the second resistive component 1030. In representative embodiments, the second resistive component 1030 is fabricated from a metal.

Figure 11A:
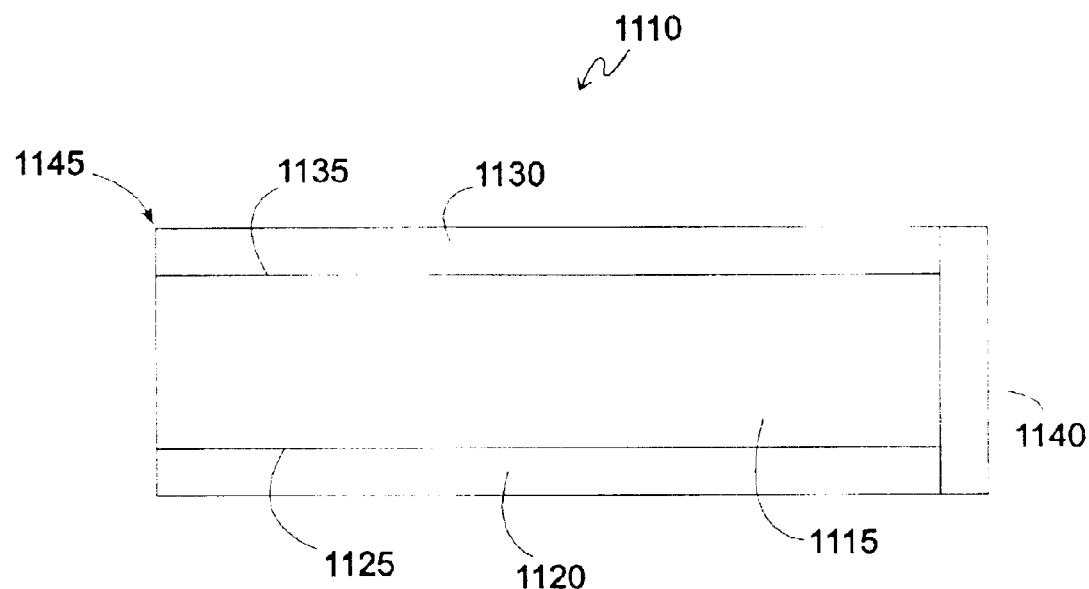
FIG. 11A is a drawing of a side view of another embodiment of a distributed capacitive/resistive electronic device consistent with the teachings of the invention.

FIG. 11A is a drawing of a side view of another embodiment of a distributed capacitive/resistive electronic device 1110 consistent with the teachings of the invention. The electronic device 1110 comprises a dielectric substrate 1115 on which a first resistive component 1120 is affixed to a first side 1125 of the dielectric substrate 1115 and on which a second resistive component 1130 is affixed to a second side 1135 of the dielectric substrate 1115. The second side 1135 is oppositely located from the first side 1125. The distributed capacitive/resistive electronic device 1110 further comprises a connecting component 1140 affixed to the dielectric substrate 1115. The connecting component 1140 further electrically connects the first resistive component 1120 to the second resistive component 1130 and is electrically connectable to other electronic circuitry, as for example the connecting transmission line 20. At a location 1145 removed from the connecting component 1140, the second resistive component 1130 is electrically connectable to additional electronic circuitry, as for example the system under test. The capacitive/resistive electronic device 1110 could be fabricated by standard thick film techniques, wherein the first and second resistive components 1120,1130 comprise resistive pastes affixed to the dielectric substrate 1115 via common thick film screening processes which are well known in the art. Typically the second resistive component 1130 has a higher resistivity than does the first resistive component 1120. The connecting component 1140 could be affixed to the dielectric substrate 1115 through a hole drilled in the dielectric substrate 1115 which is subsequently electroplated prior to the screening of the first and second resistive components 1120,1130. The connecting component 1140 could also be affixed to the dielectric substrate 1115 through the drilled hole in the dielectric substrate 1115 and then a conductive paste screened through the hole to make contact to the first and second resistive components 1120, 1130. Connection between the connecting component 1140 and the first and second resistive components 1120,1130 could also be effected via screening or electroplating around the end of the dielectric substrate 1115 without use of a drilled hole. Other means are also possible.

Figure 11B:
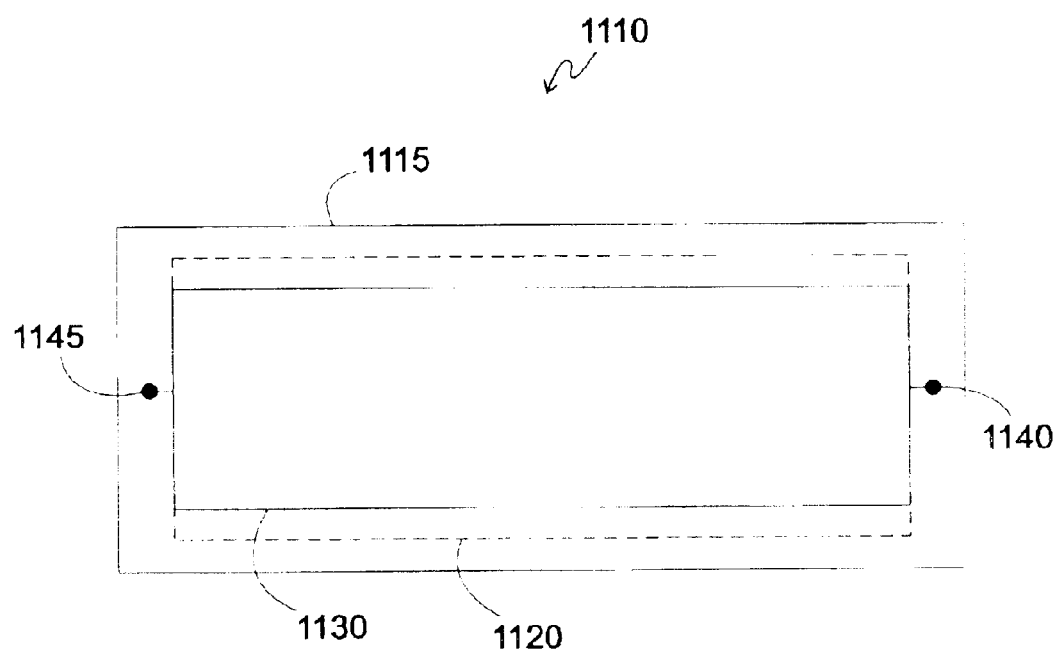
FIG. 11B is a drawing of a top view of the embodiment of the distributed capacitive/resistive electronic device of FIG. 11A.

FIG. 11B is a drawing of a top view of the embodiment of the distributed capacitive/resistive electronic device 1110 of FIG. 11A. In the representative embodiment of FIG. 11B, the first and second resistive components 1120,1130 are uniformly distributed the length of the electronic device 1110. For illustrative purposes the first resistive component 1120 is shown having greater width than that of the second resistive component 1130. However, the width of first resistive component 1120 could be the same as or less than that of the second resistive component 1130. Also in FIG. 11B, the dielectric substrate 1115 is shown as having a width greater than that of both the first and second resistive components 1120,1130. However, the width of the dielectric substrate 1115 could be equal to the width of the wider of the first and second resistive components 1120,1130. Connection between the connecting component 1140 and the first and second resistive components 1120,1130 could be effected as described above. Further in FIG. 11B, the first resistive component 1120 is shown as a rectangle. However, the geometry of the first resistive component 1120 could be any other geometry, including that of a triangle or square, found to be suitable for compensating for the lossy connecting transmission line 20. In addition, the second resistive component 1130 is shown as a rectangle. However, the geometry of the second resistive component 1130 could be any other geometry, including that of a triangle or square, found to be suitable for compensating for the lossy connecting transmission line 20.

The equivalent circuit of the distributed capacitive/resistive electronic device 1110 of FIGS. 11A–11B is the circuit of FIG. 7D.

Figure 12A:
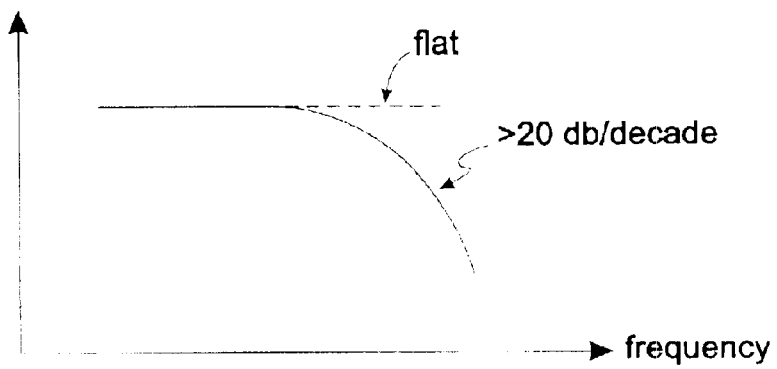
FIG. 12A is a drawing of a transfer function of the lossy connecting transmission line of FIG. 3.
Figure 12B:
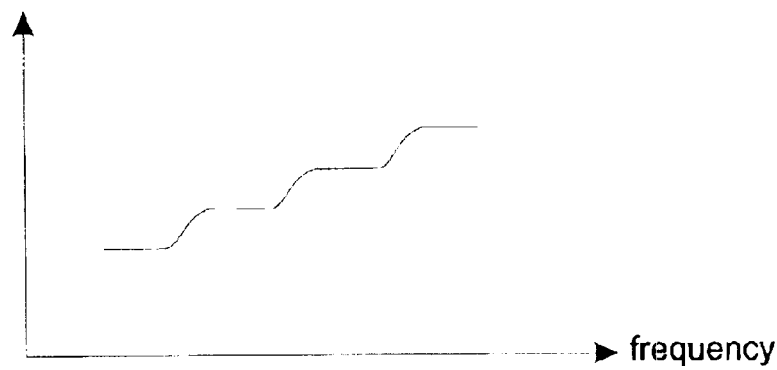
FIG. 12B is a drawing representative of the transfer function of the distributed capacitive/resistive electronic devices of FIGS. 10A–10B and 11A–11B.
Figure 12C:
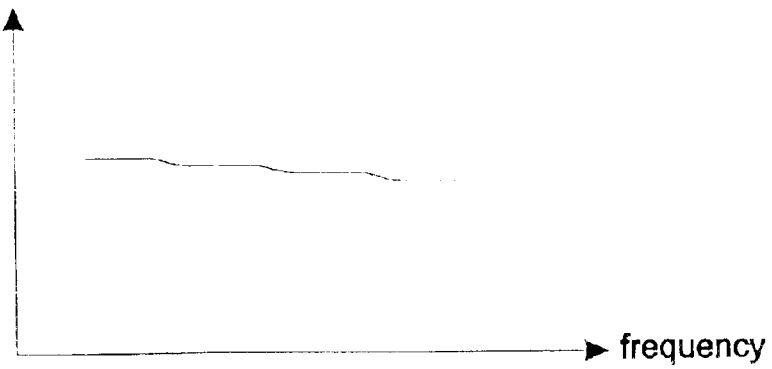
FIG. 12C is a drawing of a transfer function an embodiment a lossy connecting transmission line compensated by one of the distributed capacitive/resistive electronic devices of FIGS. 10A–10B and 11A–11B.

FIG. 12A is a drawing of a transfer function of the lossy connecting transmission line 20 of FIG. 3. FIG. 12B is a drawing representative of the transfer function of the distributed capacitive/resistive electronic devices 1010,1110 of FIGS. 10A–10B and 11A–11B. FIG. 12C is a drawing of a transfer function an embodiment a lossy connecting transmission line 20 compensated by one of the distributed capacitive/resistive electronic devices 1010,1110 of FIGS. 10A–10B and 11A–11B. Note that depending upon design parameters chosen, the distributed capacitive/resistive electronic devices 1010,1110 of FIGS. 10A–10B and 11A–11B can more closely compensate for the frequency dependence of the lossy connecting transmission line 20 over a frequency range of interest than can the discrete probe tip networks of FIGS. 7A–7B.

Determination of the values of the components, including geometries, of the distributed capacitive/resistive electronic devices 1010,1110 of FIGS. 10A–10B and 11A–11B may be determined empirically and analytically via discrete component approximations.

A primary advantage of representative embodiments as described in the present patent document over prior devices is the ability to more closely compensate for the frequency dependent losses introduced by a lossy transmission line 20.

Other possible variations in the specific embodiments disclosed are possible. It is understood that although particular embodiments of the invention have been described and illustrated herein, it is recognized that modifications and variations may readily occur to those skilled in the art and consequently, it is intended that the claims be interpreted to cover such modifications and equivalents.

What is claimed is:

1. An electronic device, comprising:
    a dielectric substrate;
    a first resistive component, wherein the first resistive component is affixed to a first side of the dielectric substrate;
    a second resistive component, wherein the second resistive component is affixed to a second side of the dielectric substrate, wherein the second side is oppositely located from the first side, and wherein the resistivity of the first resistive component is greater than ten times the resistivity of the second resistive component; and
    a connecting component, wherein the connecting component is affixed to the dielectric substrate, wherein the connecting component electrically connects the first resistive component to the second resistive component, wherein the connecting component is electrically connectable to other electronic circuitry, and wherein, at a location removed from the connecting component, the second resistive component is electrically connectable to other electronic circuitry.

2. The electronic device as recited in claim 1, wherein the geometry of the first resistive component is selected from the group consisting of a rectangle, a square, and a triangle.

3. The electronic device as recited in claim 1, wherein the geometry of the second resistive component is selected from the group consisting of a rectangle, a square, and a triangle.

4. The electronic device as recited in claim 1, wherein the material from which the second resistive component is fabricated is a metal.

* * * * *